(12) United States Patent
Zhang et al.

(10) Patent No.: US 11,882,679 B2
(45) Date of Patent: Jan. 23, 2024

(54) FLEXIBLE DISPLAY SCREEN AND FLEXIBLE DISPLAY APPARATUS

(71) Applicant: Kunshan Go-Visionox Opto-Electronics Co., Ltd., Kushan (CN)

(72) Inventors: Tan Zhang, Kunshan (CN); Xiangqian Wang, Kunshan (CN); Zhan Sun, Kunshan (CN); Yongxue Hu, Kunshan (CN); Shuihu Xiong, Kunshan (CN)

(73) Assignee: Kunshan Go-Visionox Opto-Electronics Co., Ltd.

( * ) Notice: Subject to any disclaimer, the term of this patent is extended or adjusted under 35 U.S.C. 154(b) by 265 days.

(21) Appl. No.: 17/554,524

(22) Filed: Dec. 17, 2021

(65) Prior Publication Data
US 2022/0110226 A1  Apr. 7, 2022

Related U.S. Application Data

(63) Continuation of application No. PCT/CN2020/088423, filed on Apr. 30, 2020.

(30) Foreign Application Priority Data

Aug. 16, 2019  (CN) .......................... 201921333036.6

(51) Int. Cl.
*H05K 7/20* (2006.01)
*G06F 1/16* (2006.01)
(Continued)

(52) U.S. Cl.
CPC ......... *H05K 7/20954* (2013.01); *F28F 21/06* (2013.01); *F28F 21/089* (2013.01);
(Continued)

(58) Field of Classification Search
CPC .............. G06F 1/1652; H05K 7/20954; H05K 7/20481
See application file for complete search history.

(56) References Cited

U.S. PATENT DOCUMENTS

| | | | |
|---|---|---|---|
| 5,831,374 A * | 11/1998 | Morita | H05K 7/20963 313/493 |
| 6,700,315 B2 * | 3/2004 | Kim | H05K 7/20963 362/348 |

(Continued)

FOREIGN PATENT DOCUMENTS

| | | |
|---|---|---|
| CN | 105072868 A | 11/2015 |
| CN | 206116384 U | 4/2017 |

(Continued)

OTHER PUBLICATIONS

International Search Report and Written Opinion (International Application No. PCT/CN2020/088423) with English Translation, dated Jul. 29, 2020, 12 pages.

*Primary Examiner* — Adrian S Wilson
(74) *Attorney, Agent, or Firm* — Quarles & Brady LLP

(57) ABSTRACT

Disclosed are a flexible display screen and a flexible display device. The flexible display screen includes a flexible display panel and a driver chip, the flexible display panel includes a support portion, a first heat insulation layer, a heat dissipation layer, and a second heat insulation layer which are arranged in sequence along a direction from back to a light-emitting surface, the support portion is provided with a recess, and the driver chip is received in the recess.

20 Claims, 5 Drawing Sheets

(51) Int. Cl.
  *F28F 21/06* (2006.01)
  *F28F 21/08* (2006.01)
  *G09F 9/30* (2006.01)
  *B82Y 30/00* (2011.01)
(52) U.S. Cl.
  CPC ............ *G06F 1/1652* (2013.01); *G09F 9/301* (2013.01); *H05K 7/20481* (2013.01); *B82Y 30/00* (2013.01); *F28F 2270/00* (2013.01)

(56) References Cited

U.S. PATENT DOCUMENTS

| | | | | |
|---|---|---|---|---|
| 7,323,808 B2* | 1/2008 | Kim | ............... | H05K 7/20963 313/582 |
| 7,649,313 B2* | 1/2010 | Kim | ............... | H05K 7/20963 313/46 |
| 8,988,866 B2* | 3/2015 | Gu | ............... | H04N 5/00 313/582 |
| 9,072,167 B2* | 6/2015 | Gu | ............... | H05K 5/0017 |
| 2007/0216305 A1* | 9/2007 | Yeo | ............... | H01J 11/28 313/582 |
| 2009/0096952 A1* | 4/2009 | Yeo | ............... | H05K 7/20963 349/59 |
| 2015/0253613 A1 | 9/2015 | Yoon et al. | | |
| 2019/0025629 A1* | 1/2019 | Yang | ............... | G02F 1/133603 |

FOREIGN PATENT DOCUMENTS

| | | |
|---|---|---|
| CN | 107087378 A | 8/2017 |
| CN | 107247372 A | 10/2017 |
| CN | 207347483 U | 5/2018 |
| CN | 108102576 A | 6/2018 |
| CN | 108877519 A | 11/2018 |
| CN | 108877519 A | 11/2018 |
| CN | 110060574 A | 7/2019 |
| JP | 2009086069 A | 4/2009 |

* cited by examiner

FLEXIBLE DISPLAY SCREEN AND FLEXIBLE DISPLAY APPARATUS

CROSS REFERENCE TO RELATED APPLICATIONS

The present application is a continuation of International Patent Application No. PCT/CN2020/088423, filed on Apr. 30, 2020, entitled "FLEXIBLE DISPLAY SCREEN AND FLEXIBLE DISPLAY APPARATUS" which claims priority to Chinese Patent Application No. 201921333036.6, filed on Aug. 16, 2019, entitled "FLEXIBLE DISPLAY SCREEN AND FLEXIBLE DISPLAY APPARATUS." The content of both application are hereby incorporated by reference in its entirety.

TECHNICAL FIELD

The present disclosure relates to the field of the flexible display technology.

BACKGROUND

The full-screen display is currently a hot trend in the development of the display products. At present, the full-screen display is mainly achieved by reducing the frame of the display. In the full-screen display technology, a flexible display screen is usually used. The flexible display screen is a display screen using a flexible material as a substrate material.

SUMMARY

In view of this, the present disclosure in embodiments provides a flexible display screen and a flexible display device, in order to address the technical problems that the heat dissipation of the driver chip is dissatisfied, which impacts the display effect of the flexible display screen.

The present disclosure in the embodiments provides a flexible display screen, which includes a flexible display panel, including a display region and a non-display region, the non-display region having a bending region and a binding region located at a side of the bending region away from the display region and extending to a back of the display region;
- a first heat insulation layer, a heat dissipation layer, and a second heat insulation layer which are stacked in the display region and along a direction from the back to a light-emitting surface;
- a support portion, attached to a surface of the first heat insulation layer away from the light-emitting surface and provided with a recess; and
- a driver chip electrically connected to the flexible display panel in the binding region and received in the recess.

The present disclosure in the embodiments further provides a flexible display device including the above-mentioned flexible display screen.

Since the driver chip is received in the recess provided on the support portion on the back of the display region, the heat generated by the driver chip in use will diffuse to the display region if it is not handled well, thereby affecting the display effect. In the flexible display screen provided by the embodiments of the present disclosure, by sequentially arranging the first heat insulation layer, the heat dissipation layer, and the second heat insulation layer in the display region of the flexible display panel, the heat generated by the driver chip in use can be effectively dissipated, thereby avoiding that the dissatisfied heat dissipation may affect the display effect of the flexible display screen.

DETAILED DESCRIPTION

Figure 1:
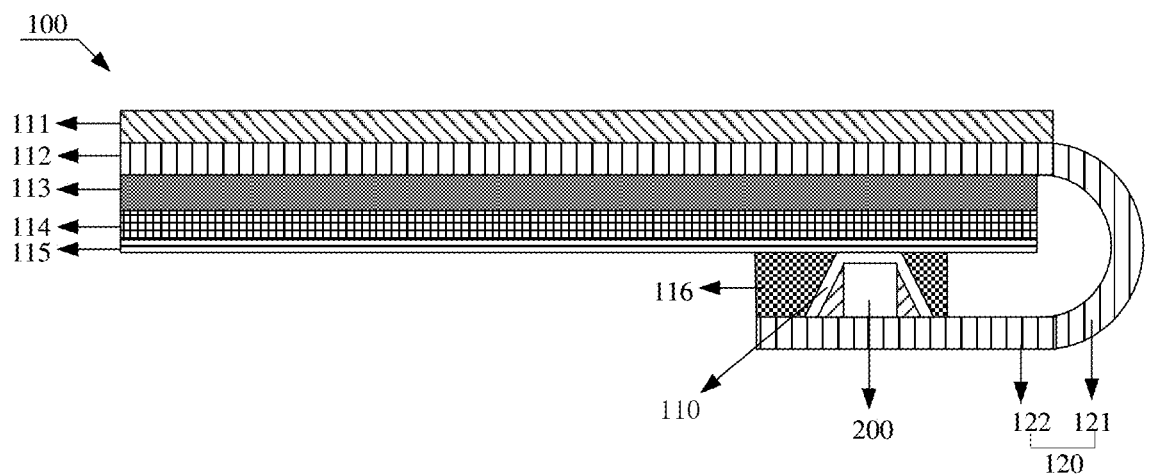
FIG. 1 is a schematic structure diagram of a flexible display screen according to an embodiment of the present disclosure.

In order to reduce the frame of the display, the binding region of the display is usually turned over to the back of the encapsulated layer through a bending design. In such a way, after the driver chip (IC) is fixed and electrically connected to the binding region of the display, the IC is also subsequently placed on the back of the encapsulated layer (such design is referred to as a COF design). At present, in use of the full-screen displays, especially in the high-temperature environment, the display effect is dissatisfied, and local regions are prone to display abnormalities such as yellowish spots and dark spots. The technical solution of the present disclosure will be clearly and completely described below in conjunction with specific embodiments of the present disclosure and the corresponding drawings. Apparently, the described embodiments are merely some embodiments of the present disclosure, rather than all the embodiments. Based on the embodiments in the present disclosure, all other embodiments obtained by those of ordinary skill in the art without creative work shall fall within the protection scope of the present disclosure.

In the full-screen display technology, a flexible display screen is usually used, which is a display screen using a flexible material as a substrate material. Compared to the display screen using the glass as the substrate material, the flexible display screen has characteristics of lightness and thinness, bendability, and impact resistance. In this case, the distance between the integrated circuit IC provided on the back of the encapsulated layer (located in the display region) and the encapsulated layer is very short by adopting the COF design. When the IC works in a high temperature environment, the heat generated easily accumulates, which may result in that the display pixels at a position corresponding to the IC are unbearable, and display abnormalities, such as yellowish and dark spots, occur, and even that other parts of the encapsulated layer are scalded, for example, the polarizer and other parts in the position corresponding to the IC are scalded.

Therefore, it is necessary to take corresponding measures to address the above problems and improve the high temperature tolerance of the encapsulated layer, such that the product can work normally in a relatively high temperature environment, and accordingly the reliability of the product is improved.

The flexible display screen in the embodiments of the present disclosure refers to a display screen in which a non-display region is bent. For the flexible display screen with the non-display region bent, the technical solution provided by the embodiments of the present disclosure can make the driver chip in the flexible display screen fixed on the back of the display region to realize the full-screen display; and by rationally planning the heat dissipation channel, the impact of the heat dissipation of the driver chip on the display region is effectively reduced, and then the display effect of the flexible display screen is affected in the high temperature environment.

The technical solution provided by the embodiments of the present disclosure will be described in detail below with reference to the accompanying drawings.

Embodiment I

As shown in FIG. 1, the flexible display screen in this embodiment includes a flexible display panel 100 and a driver chip 200. The flexible display panel 100 includes a display region and a non-display region 120. The display region of the flexible display panel includes an encapsulated layer 111, an array film layer 112, a second heat insulation layer 113, a heat dissipation layer 114, a first heat insulation layer 115 and a support portion 116. A recess 110 with an opening facing away from the encapsulated layer 111 is formed on the support portion 116. The non-display region 120 includes a bending region 121 and a binding region 122. The binding region 122 is located at a side of the bending region 121 away from the display region and extends to the back of the display region (opposite to the light-emitting surface). The driver chip 200 is electrically connected to the binding region 122 and is received in the recess 110. In the embodiment of the present disclosure, by providing the recess 110 on the support portion 116 and receiving the driver chip 200 in the recess 110, the space can be reasonably used, the structure of the flexible display panel can be simplified, and the bending and deformation of the screen caused by the movement of the driver chip can be effectively avoided without affecting the display effect of the flexible display screen. In this embodiment, the array film layer 112 is provided between the encapsulated layer 111 and the second heat insulation layer 113; the second heat insulation layer 113, the heat dissipation layer 114, the first heat insulation layer 115, and the support portion 116 are sequentially arranged on a side of the array film layer 112 away from the encapsulated layer 111. Under such structure, a composite layer structure of heat insulation-heat dissipation-heat insulation is formed between the driver chip and the encapsulated layer, which can effectively disperse heat conduction, thereby reducing the impact of the heat dissipation of the driver chip on the array film layer 112, such that the flexible display screen can still maintain a good display effect even in a high temperature environment. The second heat insulation layer 113, the heat dissipation layer 114, the first heat insulation layer 115, and the support portion 116 in this embodiment only need to be arranged in order, and other functional layers can also be inserted therebetween, as long as the heat dissipation-heat insulation effect is not affected. The array film layer 112 in this embodiment may include a transistor and a wiring layer, and may further include an insulation layer and a planarization layer.

In this embodiment, the support portion 116 is directly formed with a recess 110; the support portion 116 is glued to a side of the first heat insulation layer 115 away from the light-emitting surface; and the array film layer 112 is bent and the driver chip 200 is received in the recess 110. The material of the support portion 116 is a heat dissipation material, such as an adhesive tape with a heat dissipation effect, or other materials with better heat dissipation performance. By using the heat dissipation material as the support portion, the support portion has functions of support (also referred to as bolster) and heat dissipation. Under the condition of rational use of the structure space, the heat conduction is better implemented. In another embodiment, the support portion can also be of a common support material, as long as the heat dissipation-heat insulation effect is not affected.

In this embodiment, as shown in FIG. 1, the recess 110 is a through recess 110. In another embodiment, the recess 110 may not be a through recess 110. In an embodiment, in order to reduce the total thickness of the support portion 116, the depth of the recess 110 can be greater than or equal to ⅔ of the thickness of the support portion 116.

In this embodiment, the thickness of the driver chip 200 (parallel to the thickness direction of the support portion 116) is less than the depth of the recess 110. For example, if the thickness of the driver chip is 0.2 mm, the depth of the recess 110 needs to be greater than 0.2 mm; moreover, in the same plane (perpendicular to the thickness direction of the support portion 116), the cross-sectional area of the driver chip 200 is also less than the cross-sectional area of the recess 110. For example, if the shape of the cross section of the driver chip 200 is a rectangle, and the length of the rectangle is 0.3 mm and the width is 0.2 mm, the length of the rectangle of the cross section of the recess 110 needs to be greater than 0.3 mm, and the width needs to be greater than 0.2 mm. In such structure, there is a gap between the driver chip 200 and an inner wall of the recess 110, and such gap is conducive to the rapid diffusion of heat. In another embodiment, the structure of the driver chip 200 can also be adapted to the structure of the recess 110.

In this embodiment, the driver chip 200 is fixed to the binding region of the flexible display screen through the heat dissipation tape, so that the heat generated by the IC can be dissipated as soon as possible while the driver chip is fixed, thereby preventing the local temperature from rising continuously, and protecting the IC while protecting the encapsulated layer. In an embodiment, there is a gap between the heat dissipation tape fixing the driver chip 200 and the inner wall of the recess 110 on the support portion 116, to facilitate rapid heat dissipation.

In this embodiment, the flexible display screen adopts a COF structure, that is, the driver chip is directly fixed on the binding region. In another embodiment, the driver chip can also be connected to the binding region through a flexible circuit board.

In the flexible display screen provided by the embodiments of the present disclosure, since the driver chip is received in the recess 110 provided on the support portion on the back of the display region, the heat generated by the driver chip in use may be diffused to the display region if it is not handled well, and affect the display effect. In the present disclosure, by sequentially providing the first heat insulation layer, the heat dissipation layer, and the second heat insulation layer in the display region of the flexible display panel, the heat generated by the driver chip in use can be effectively dissipated, thereby avoiding that the dissatisfied heat dissipation may affect the display effect of the flexible display screen.

Embodiment II

Figure 2:
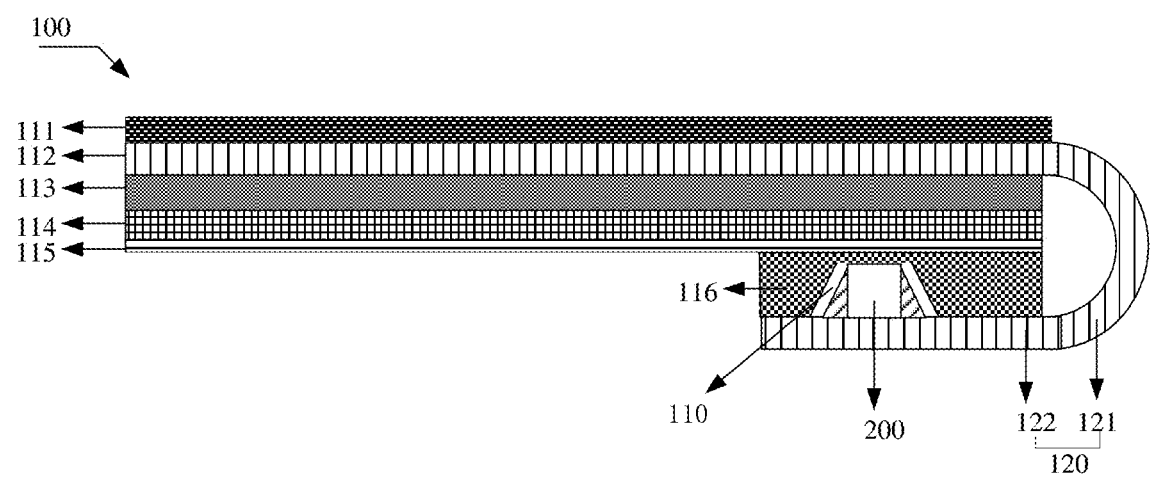
FIG. 2 is a schematic structure diagram of a flexible display screen according to another embodiment of the present disclosure.

Referring to FIG. 2, the flexible display screen in this embodiment differs from the flexible display screen in the Embodiment I in that the recess 110 on the support portion 116 in this embodiment is not a through structure, and the driver chip 200 is in contact with the support portion 116.

In this embodiment, the recess on the support portion 116 is not a through structure, and the depth of the recess 110 is less than the thickness of the support portion 116. Specifically, the depth of the recess 110 can be less than two thirds of the thickness of the support portion 116. The driver chip 200 is in contact with the support portion 116, so that the structure of the driver chip 200 is more stable.

In this embodiment, in the same plane (perpendicular to the thickness direction of the support portion 116), the cross-sectional area of the driver chip 200 is still less than the cross-sectional area of the recess 110. Such structure can maintain the gap between a lateral surface of the driver chip 200 and the side wall of the recess 110 while fixing and tightening the driver chip 200, in order to achieve a better heat dissipation effect.

In this embodiment, the support portion 116 is made of a heat dissipation material, and the bottom surface of the recess 110 is in contact with the driver chip 200, which can assist in transferring the heat generated by the driver chip 200 in use while providing the support for the driver chip 200.

In this embodiment, the driver chip 200 is directly in contact with the bottom surface of the recess 110. In another embodiment, the driver chip 200 can also abut against the bottom surface of the recess 110 through other heat dissipation materials or heat insulation materials.

In the flexible display screen provided by the embodiments of the present disclosure, since the depth of the recess 110 is less than the thickness of the support portion, a part of the heat dissipation material (material of the support portion) remains at the bottom of the recess 110. The driver chip received in the recess 110 is in contact with the bottom surface of the recess 110, in such a way, the heat dissipation material adopted in the support portion can be utilized to provide an effective heat conduction path for the driver chip while ensuring the relatively stable structure of the driver chip, thereby effectively dissipating the heat generated by the driver chip in use, and avoiding that the dissatisfied heat dissipation may affect the display effect of the flexible display screen.

Embodiment III

Figure 3:
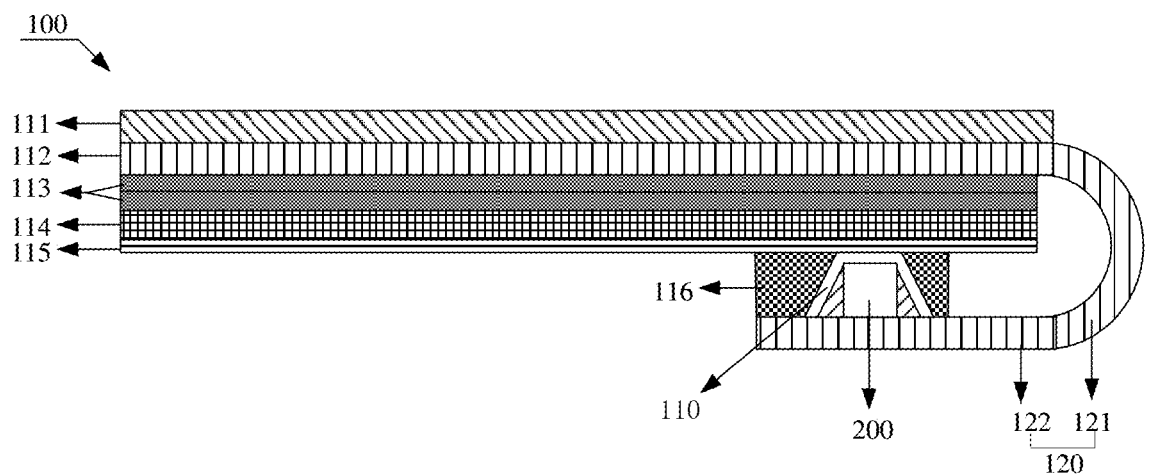
FIG. 3 is a schematic structure diagram of a flexible display screen according to another embodiment of the present disclosure.

As shown in FIG. 3, the flexible display screen in this embodiment includes a flexible display panel 100 and a driver chip 200. The flexible display panel 100 includes a display region and a non-display region 120. The non-display region includes a bending region 121 and a binding region 122. The binding region 122 is located at a side of the bending region 121 away from the display region and extends to the back of the display region. The driver chip 200 is electrically connected to the binding region 122.

The display region of the flexible display panel 100 includes an encapsulated layer 111, an array film layer 112, a second heat insulation layer 113, a heat dissipation layer 114, a first heat insulation layer 115 and a support portion 116. A recess is formed on the support portion 116, and the driver chip is received in the recess 110.

Compared to the embodiment I, the heat dissipation layer 114 in this embodiment includes two heat dissipation sub-layers. The two stacked sub-heat dissipation layers are provided, which is beneficial to improve the direction of heat transfer, and block the expansion of the heat along the thickness direction of the heat dissipation layer 114 to a certain extent, and meanwhile promote the conduction of the heat in the plane direction (perpendicular to the thickness direction), thereby reducing the impact on the encapsulated layer 111.

In this embodiment, the heat dissipation layer 114 includes two heat dissipation sub-layers. In another embodiment, the heat dissipation layer 114 may not be limited to including two heat dissipation sub-layers, there may be only one layer (see FIG. 1), or there may be more than two heat dissipation sub-layers, such as three, four, or even five sub-heat dissipation layers.

In this embodiment, the materials of the two heat-dissipation sub-layers of the heat dissipation layer 114 are different. In another embodiment, the materials of the sub-heat dissipation layers can also be the same. The material of the sub-heat dissipation layer can be selected as a material with a high thermal conductivity in the plane direction, so as to prevent the display pixels and the polarizer in the flexible display panel at the position corresponding to the IC from being damaged by the heat, and the resulting product failure. For example, the specific material can be graphite carbon, graphene, copper foil, aluminum foil, etc.

In this embodiment, for the two heat dissipation sub-layers in the heat dissipation layer 114, one layer is a metal heat dissipation layer, and the other is a carbon-containing heat dissipation layer; and the metal heat dissipation layer is located at a side of the carbon-containing heat dissipation layer away from the first heat insulation layer. Such structure design is conducive to optimizing the heat conduction effect. In another embodiment, the sub-heat dissipation layer can also be made of other heat dissipation materials, and the positions of different sub-heat dissipation layers can also be changed.

In this embodiment, the cost and thermal conductivity are taken into account comprehensively, the material of the metal heat dissipation layer may be copper foil or aluminum foil. In another embodiment, other metal materials can also be selected. The cooperation with the metal heat dissipation layer is taken into account, the material of the carbon-containing heat dissipation layer can be graphite carbon or graphene. In another embodiment, it is not limited to these materials.

In this embodiment, in order to prevent the thickness of the flexible display panel from increasing excessively due to the adding of the stacked sub-heat dissipation layers, a coating or plating can be utilized to reduce the thickness of the heat dissipation layer as much as possible. It can be that all layers in the heat dissipation layer use the coating or plating, or only some layers use the coating or plating, or all layers do not use the coating or plating. In this embodiment, the metal heat dissipation layer is a metal coating layer, and the carbon-containing heat dissipation layer is a nano-coating layer. In this embodiment, for the two heat dissipation sub-layers in the heat dissipation layer 114, the thickness of each sub-heat dissipation layer is not greater than 10 μm, for example, the thickness of each metal heat dissipation layer is 2 μm, and the thickness of the carbon-containing heat dissipation layer is 3 μm.

In the flexible display screen provided by the embodiments of the present disclosure, the first heat insulation layer, the heat dissipation layer, and the second heat insulation layer are sequentially provided in the display region of the flexible display panel, which can effectively dissipate the heat generated by the driver chip in use. At the same time, the heat transmission path is improved by providing multiple sub-heat dissipation layers in the heat dissipation layer, which is beneficial to better dissipate the heat generated by the driver chip in use, thereby avoiding that the dissatisfied heat dissipation affects the display effect of the flexible display screen.

Embodiment IV

Figure 4:
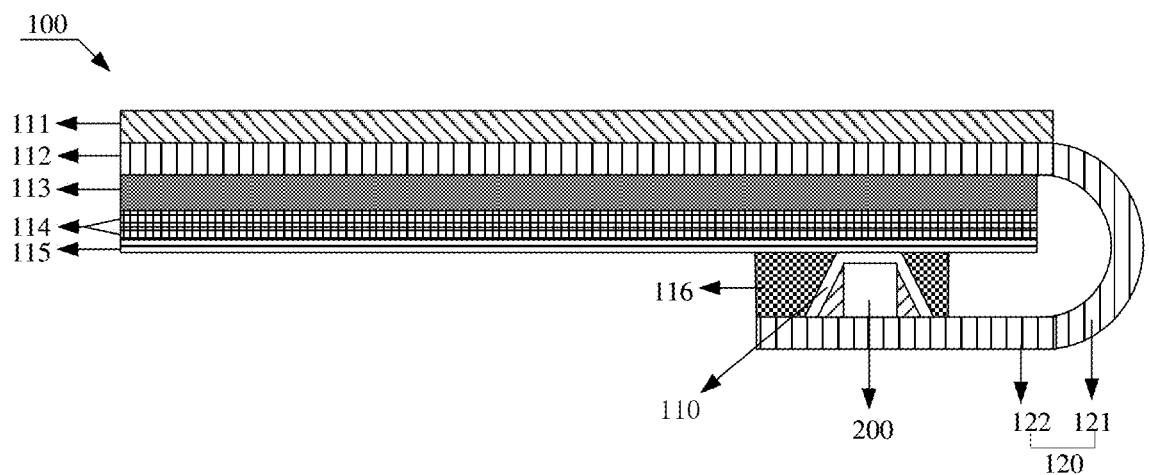
FIG. 4 is a schematic structure diagram of a flexible display screen according to another embodiment of the present disclosure.
Figure 5:
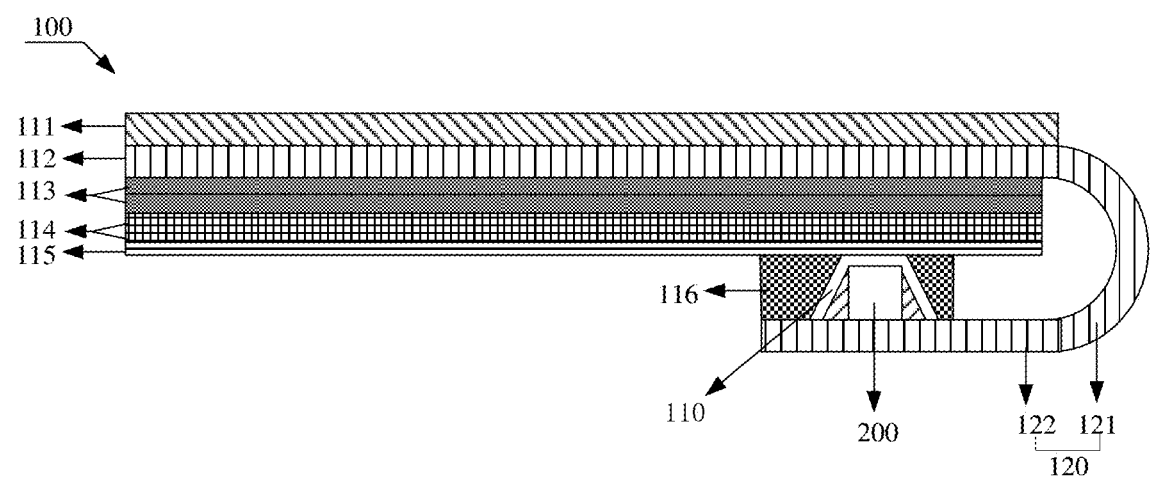
FIG. 5 is a schematic structure diagram of a flexible display screen according to another embodiment of the present disclosure.

As shown in FIGS. 4 and 5, the flexible display screen in this embodiment includes a flexible display panel 100 and a driver chip 200. The flexible display panel 100 includes a display region and a non-display region 120. The non-display region includes a bending region 121 and a binding region 122. The binding region 122 is located at a side of the bending region 121 away from the display region and extends to the back of the display region. The driver chip 200 is electrically connected to the binding region 122.

The display region of the flexible display panel 100 includes an encapsulated layer 111, an array film layer 112, a second heat insulation layer 113, a heat dissipation layer 114, a first heat insulation layer 115, and a support portion 116. A recess 110 is formed on the support portion 116, and the driver chip is received in the recess 110.

Compared to the Embodiment I and Embodiment III, the second heat insulation layer 113 in this embodiment includes two heat insulation sub-layers. By providing two stacked sub-heat insulation layers, it is beneficial to strengthen the heat insulation effect of the second heat insulation layer, and can better block the expansion of heat along the thickness direction of the second heat insulation layer 113, and meanwhile can cause the heat to return to conduct from the heat dissipation layer, thereby reducing the impact on the encapsulated layer 111.

In this embodiment, the second heat insulation layer 113 includes two heat insulation sub-layers. In another embodiment, the second heat insulation layer 113 may not be limited to include two heat insulation sub-layers, which can have only one sub-heat insulation layer (see FIGS. 1 and 2), or can have more than two heat insulation sub-layers, for example, three, four, or even five sub-heat insulation layers.

In this embodiment, the materials of the two heat insulation sub-layers in the second heat insulation layer 113 are different. In another embodiment, the materials of the two heat insulation sub-layers can also be the same. By arranging two heat insulation sub-layers with different materials and using the characteristics of different materials with different heat insulation effects, it is more conducive to blocking the propagation of the heat, thereby reducing the impact of the heat dissipation of the driver chip on the array film layer 112. The materials of the two heat insulation sub-layers can be inorganic compound or organic polymer materials with better heat resistance, such as high-temperature resistant PI, PET, foam, metal, etc.

In this embodiment, one sub-heat insulation layer in the second heat insulation layer 113 is heat insulation foam, and the other sub-heat insulation layer is heat insulation PET tape. The heat insulation PET tape is located at a side of the heat insulation foam away from the heat dissipation layer 114. The materials in another embodiment is not limited to the above, and can be any high temperature resistant inorganic compound or organic polymer material. In this embodiment, by making at least one sub-heat insulation layer in the second heat insulation layer 113 be the heat insulation foam, which can be double as a buffer layer by using the cushioning effect of the foam, thereby reducing the thickness of the thermal display screen while achieving the heat insulation and buffering.

In this embodiment, for the structure of the multiple sub-heat insulation layers provided with respect to the second heat insulation layer 113, the first heat insulation layer 115 is only a single-layer structure. For example, a heat insulation tape can be selected, which can implement the insulation and bonding functions while satisfying the requirement of the heat insulation, and such multi-functional composite integration is beneficial to control the thickness of the flexible display screen.

In the flexible display screen provided by the embodiments of the present disclosure, by sequentially arranging the first heat insulation layer, the heat dissipation layer and the second heat insulation layer in the display region of the flexible display panel, it can effectively dissipate the heat generated by the driver chip in use; at the same time, by providing multiple sub-heat insulation layers in the second heat insulation layer, it is beneficial to better block the heat transmission, and is beneficial to better dissipate the heat generated by the driver chip in use, thereby avoiding that the dissatisfied heat dissipation may affect the display effect of the flexible display screen.

It should be noted that for the flexible display screen described in any one of the above-mentioned Embodiments I to IV, since the driver chip is received in the support structure, the thickness of the overall flexible display screen can be reduced. Due to the reasonable arrangement of the support portion, the first heat insulation layer, the heat dissipation layer and the second heat insulation layer, the transmission path of the heat generated by the driver chip is improved, which is beneficial to better dissipate the heat generated by the driver chip in use, thereby avoiding that the dissatisfied heat dissipation may affect the display effect of the flexible display screen.

In an embodiment of the present disclosure, a flexible display device is further provided, which includes the above-mentioned flexible display screen. The flexible display device provided by the embodiment of the present disclosure include, but are not limited to, a mobile phone, a tablet, a notebook computer, a vehicle-mounted display screen, and the like.

Those skilled in the art should understand that the present disclosure is described with reference to the flow charts and/or block diagrams of the method and device (equipment) according to the embodiments of the present disclosure. Although some exemplary embodiments of the present disclosure have been described, those skilled in the art can make additional alterations and modifications to these embodiments once they learn the basic creative concept. Therefore, the appended claims are intended to be interpreted as including the exemplary embodiments and all alterations and modifications falling within the scope of the present disclosure.

The above descriptions are merely some exemplary embodiments of the present disclosure, and are not used for limiting the present disclosure. For those skilled in the art, the present disclosure can have various modifications and alterations. Any modification, equivalent replacement, improvement, etc., made within the spirit and principle of the present disclosure shall be included in the scope of protection of the claims of the present disclosure.

What is claimed is:
1. A flexible display screen, comprising:
   a flexible display panel, comprising a display region and a non-display region, the non-display region having a bending region and a binding region located at a side of the bending region away from the display region and extending to a back of the display region;

a first heat insulation layer, a heat dissipation layer, and a second heat insulation layer which are stacked in the display region and along a direction from the back to a light-emitting surface; and a support portion, disposed below the first heat insulation layer away from the light-emitting surface and provided with a recess for receiving a driver chip.

2. The flexible display screen according to claim 1, further comprising a driver chip electrically connected to the binding region of flexible display panel;

wherein a material of the support portion comprises a heat dissipation material.

3. The flexible display screen according to claim 1, wherein a thickness of the driver chip is less than or equal to a depth of the recess, and a cross-sectional area of the driver chip is less than a width of the recess in a same plane.

4. The flexible display screen according to claim 1, wherein a depth of the recess is greater than or equal to two thirds of a thickness of the support portion.

5. The flexible display screen according to claim 1, wherein there is a gap between the driver chip and an inner wall of the recess.

6. The flexible display screen according to claim 3, wherein the driver chip is fixed in the binding region by a heat dissipation tape.

7. The flexible display screen according to claim 3, wherein the driver chip is connected to the binding region of the flexible display panel by a flexible circuit board.

8. The flexible display screen according to claim 6, wherein a gap is configured between the heat dissipation tape and an inner wall of the recess.

9. The flexible display screen according to claim 1, wherein a depth of the recess is less than a thickness of the support portion, and the driver chip is in contact with the recess.

10. The flexible display screen according to claim 9, wherein a cross-sectional area of the driver chip is less than a cross-sectional area of the recess.

11. The flexible display screen according to claim 9, wherein the driver chip is directly in contact with a bottom surface of the support portion, or the driver chip is in contact with the support portion through a heat dissipation material or a heat insulation material.

12. The flexible display screen according to claim 1, wherein the heat dissipation layer comprises at least two heat dissipation sub-layers and adjacent two of the at least two heat dissipation sub-layers have different materials.

13. The flexible display screen according to claim 12, wherein a thickness of each of the at least two heat dissipation sub-layers is not greater than 10 μm.

14. The flexible display screen according to claim 12, wherein at least one of the at least two heat dissipation sub-layers is a metal heat dissipation layer, at least one of the at least two heat dissipation sub-layers is a carbon-containing heat dissipation layer, and the metal heat dissipation layer is located at a side of the carbon-containing heat dissipation layer away from the first heat insulation layer.

15. The flexible display screen according to claim 14, wherein the metal heat dissipation layer is a metal coating layer, and the carbon-containing heat dissipation layer is a nano-coating layer.

16. The flexible display screen according to claim 1, wherein the second heat insulation layer comprises at least two heat insulation sub-layers, and adjacent two of the at least two heat insulation sub-layers comprise different materials.

17. The flexible display screen according to claim 16, wherein one of the at least two heat insulation sub-layers is made of a heat insulation foam, and another is a heat insulation PET tape, and the heat insulation PET tape is located at a side of the heat insulation foam away from the heat dissipation layer.

18. The flexible display screen according to claim 17, wherein the flexible display screen further comprises a buffer layer and the buffer layer and at least one of the at least two heat insulation sub-layers are made of the heat insulation foam.

19. The flexible display screen according to claim 1, wherein the first heat insulation layer is configured as a single-layer structure comprising heat insulation tape.

20. A flexible display device, comprising the flexible display screen according to claim 1.

* * * * *